(12) United States Patent
Tihanyi

(10) Patent No.: US 6,313,506 B1
(45) Date of Patent: Nov. 6, 2001

(54) SILICON-ON-INSULATOR FIELD EFFECT TRANSISTOR

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/157,660

(22) Filed: Sep. 21, 1998

(30) Foreign Application Priority Data

Sep. 19, 1997 (DE) .............................................. 197 41 363

(51) Int. Cl.[7] .................................................. H01L 27/01
(52) U.S. Cl. ............................. 257/347; 257/621; 257/330
(58) Field of Search .................................... 257/347, 330, 257/621

(56) References Cited

U.S. PATENT DOCUMENTS 5,736,751 * 4/1998 Mano et al. ........................... 257/347
6,049,110 * 4/2000 Koh ...................................... 257/347
6,087,698 * 7/2000 Saito et al. ........................... 257/347
6,175,135 * 1/2001 Liao ..................................... 257/347

OTHER PUBLICATIONS

"Microelectronic Memory" (Rhein et al.), Springer Verlag Wien, 1992, pp. 86–87; 12/92.
"Silicon–on–Insulator Ics—Computer Security—Origins of the pn Junction" (Alles), IEEE Spectrum, Jun. 1997, pp. 37–45.

* cited by examiner

*Primary Examiner*—Mark V. Prenty
(74) *Attorney, Agent, or Firm*—Herbert L. Lerner; Laurence A. Greenberg; Werner H. Stemer

(57) ABSTRACT

The SOI-FET has source and drain zones of one conductivity type arranged on an insulator. A semiconductor zone of another conductivity type ("body") is arranged between the source and drain zones. A trench is introduced into the semiconductor zone of the other conductivity type. The trench is filled with an electrode material, which is capacitively or directly coupled to the semiconductor zone of the other conductivity type.

14 Claims, 2 Drawing Sheets

SILICON-ON-INSULATOR FIELD EFFECT TRANSISTOR

BACKGROUND OF THE INVENTION

FIELD OF THE INVENTION

The invention is in the field of semiconductors. More specifically, the invention pertains to an SOI-FET (SOI: "Silicon-On-Insulator") having a gate provided on an insulating layer, source and drain zones of one conductivity type which are arranged on an insulator with respect to the gate, and having a semiconductor zone ("body") of the other conductivity type which is arranged between the source and drain zones.

Thin SOI transistors for fast low-voltage ICs have become increasingly important in recent times (see, for example, the paper "Thin-Film SOI Emerges" by Michael L. Alles in IEEE Spectrum, June 1997, pages 37–45). If the gate electrode is capacitively coupled to the semiconductor zone between source and drain zones, the semiconductor zone being referred to as "body", in such SOI-FETs, then the reverse current is considerably reduced in the off state. This relationship is illustrated in FIG. 6, in which the gate-source voltage $U_{GS}$ is plotted in V on the abscissa and the logarithm of the source-drain current $I_{SD}$ is plotted on the ordinate. At a point $a_1$, a curve (a) illustrates the reverse current without capacitive coupling between the gate electrode and the "body", while at a point $b_1$, a curve (b) specifies the reverse current with capacitive coupling between gate electrode and "body". It can immediately be seen from the diagram of FIG. 6 that the reverse current becomes smaller with capacitive coupling between the gate electrode and the "body".

FIG. 7 illustrates a circuit diagram of an SOI-FET 1 having a capacitor $C_K$ for capacitive coupling between a gate electrode G and the "body" B of the SOI-FET 1 between a source electrode S and a drain electrode D. If the gate electrode G is directly connected to the "body" B then a connection indicated by dashed lines is present.

The coupling capacitance of the capacitor $C_K$ should intrinsically be as large as possible since a high coupling capacitance means a low reverse current. That is to say the reverse current becomes smaller, the greater the coupling capacitance between the gate electrode G and the "body" B is.

However, capacitances are generally proportional to the area of the electrodes that form them. Accordingly, an intrinsically desired large coupling capacitance necessitates a large area, which is precisely the opposite of what is striven for in the context of integrated circuits with the generally necessary miniaturization of circuits.

SUMMARY OF THE INVENTION

It is accordingly an object of the invention to provide an SOI FET, which overcomes the above-mentioned disadvantages of the heretofore-known devices and methods of this general type and which has a large coupling capacitance between gate electrode and "body", but requires only relatively little area.

With the foregoing and other objects in view there is provided, in accordance with the invention, an SOI-FET (silicon-on-oxide field effect transistor), comprising:

an insulator;

source and drain zones of a first conductivity type disposed on the insulator;

a gate insulating layer disposed on the source and drain zones;

a gate disposed on the gate insulating layer;

a semiconductor zone of a second conductivity type disposed between the source and drain zones; the semiconductor zone having a trench formed therein, and gate electrode material filling the trench, wherein the gate electrode material filling the trench is coupled to the semiconductor zone.

In other words, the object is satisfied in that the trench in the semiconductor body is filled with an electrode material that is capacitively or directly coupled to the semiconductor body.

The area of the coupling capacitance between the gate electrode and the semiconductor body is enlarged in conjunction with a reduced distance between these. A quite considerable increase in the coupling capacitance is therefore achieved in this way. This means, however, that the SOI-FET according to the invention has a considerably reduced reverse current compared with the prior art.

The additional outlay caused by the invention is extremely slight since only one "trench" need be introduced into the semiconductor zone of the other conductivity type, or the "body", which can be effected by a customary etching step.

The formation of trench depressions is already known from the prior art in the context of memory cells. Reference is made for this purpose, for example, to "Microelectronic Memories", Dietrich Rhein, Heinz Freitag, Springer-Verlag Vienna, 1992, pages 86–87.

In accordance with an added feature of the invention, the trench is offset laterally with respect to an imaginary connecting line between the source and drain zones.

In accordance with an additional feature of the invention, the trench is partly formed in a region between the source and drain zones. Alternatively, the trench is formed entirely outside the region between the source and drain zones.

In accordance with another feature of the invention, the gate electrode material is directly connected to the semiconductor zone of the second conductivity type in a bottom region of the trench and/or in a side wall region of the trench. In other words, if a direct connection between the electrode material and the semiconductor zone of the other conductivity type (i.e., the body) is sought, then this can be effected by connecting the electrode material in the region of the bottom of the depression directly to the semiconductor zone. It is also possible to connect the electrode material additionally in the region of the side walls directly to the semiconductor zone.

In accordance with a further feature of the invention, the semiconductor zone underneath the trench is heavily doped by implantation.

In accordance with again a further feature of the invention, the semiconductor zone of the second conductivity type is p-doped.

Polycrystalline silicon or aluminum can be used, for example, for the electrode material. The semiconductor zone is p-doped and it has a particularly high doping concentration underneath the depression. This can be effected by corresponding implantation of boron, for example.

In accordance with other features of the invention, the trench is a substantially circular trench, and it may have a diameter between 0.1 and 0.5 µm. The gate insulating layer has a preferred thickness between 1 and 10 nm. In a preferred embodiment, the source and drain zones together with the semiconductor zone enclose an area of about 0.5×0.2 µm.

In accordance with a concomitant feature of the invention, the source and drain zones and the semiconductor zone have a thickness of between 0.1 and 1.0 μm.

Other features which are considered as characteristic for the invention are set forth in the appended claims.

Although the invention is illustrated and described herein as embodied in a SOI-FET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
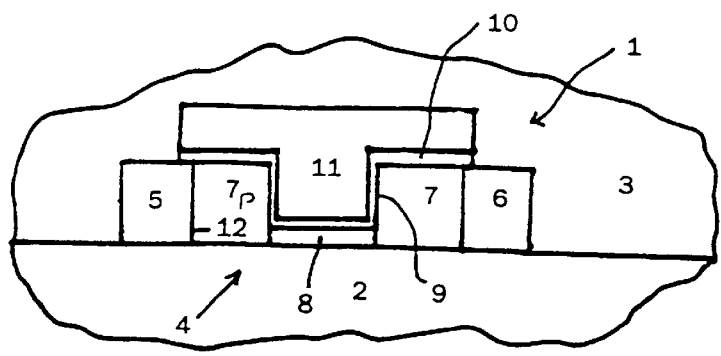
FIG. 1 is a sectional view through an SOI-FET according to a first exemplary embodiment of the invention.

Referring now to the figures of the drawing in detail and first, particularly, to FIG. 1 thereof, there is seen a section through an SOI-FET 1, which is encapsulated between a buried oxide 2 and an insulating oxide 3. The two oxides 2, 3 may be silicon dioxide, for example.

Instead of oxides, it is also possible to use other suitable insulator materials, such as silicon nitride, for example.

A so-called silicon island 4 is disposed on the buried oxide 2. The island 4 is formed of $n^+$-conducting source and drain zones 5, 6 and a p-conducting semiconductor zone 7, included in which is a $p^+$-conducting semiconductor zone 8.

The conductivity types specified may also be reversed, if appropriate. That is to say the zones 5, 6 may also be $p^+$-doped if the zones 7, 8 are then n-doped. The zones 5 to 8 have a thickness or depth of about 0.1 to 1.0 μm and enclose an area of about 0.5×0.2 μm.

According to the invention, a depression or trench 9 is introduced into the semiconductor zones 7, 8, which can be effected by etching, for example.

Figure 2:
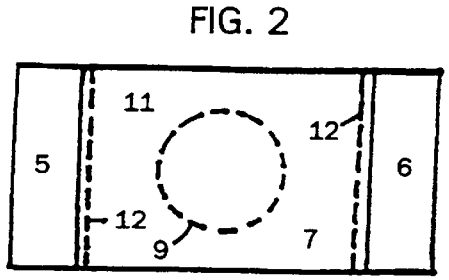
FIG. 2 is a plan view of a part of the SOI-FET of FIG. 1.

As is shown in FIG. 2, which illustrates a plan view of the SOI-FET of FIG. 1 without the oxides 2, 3, the trench 9 is circular, for example, and is located between the source and drain zones 5 and 6.

An insulating layer 10 having a thickness of about 1 to 10 nm and made, for example, of silicon dioxide or silicon nitride or a combination of these materials is arranged on the zones 7, 8. Above this gate insulating layer 10, the depression 9 is filled with an electrode material 11 made, for example, of $n^+$-doped polycrystalline silicon. Like the gate insulating layer 10, this electrode material extends beyond the edge 12 of the $n^+$-doped source and drain zones 5, 6. The edge is indicated by dashed lines in FIG. 2.

Figure 3:
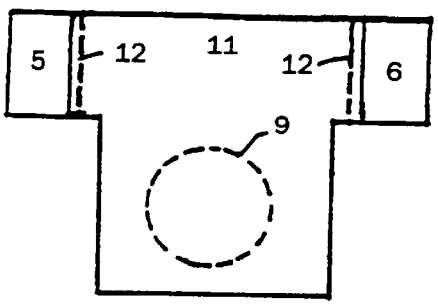
FIG. 3 is a plan view of an exemplary embodiment that is modified with respect to FIG. 1 and in which the depression is offset with respect to the connecting line between source and drain zones.

The trench 9 may now be in the region between the source and drain zones 5, 6 (cf. FIG. 2) or offset with respect to the line connecting the source and drain zones 5, 6 (cf. FIG. 3). It is alternatively possible to arrange the depression 9 such that the latter partly overlaps the region between the source and drain zones 5, 6, that is to say is moved further "upward" in the plane of the drawing in the exemplary embodiment of FIG. 3.

The semiconductor zones 7, 8 are preferably floating or ground-free, while the source and drain zones 5, 6 are connected in a suitable manner to corresponding, non-illustrated electrodes. Likewise, an external terminal is also routed to the electrode material 11 (gate electrode).

Figure 4:
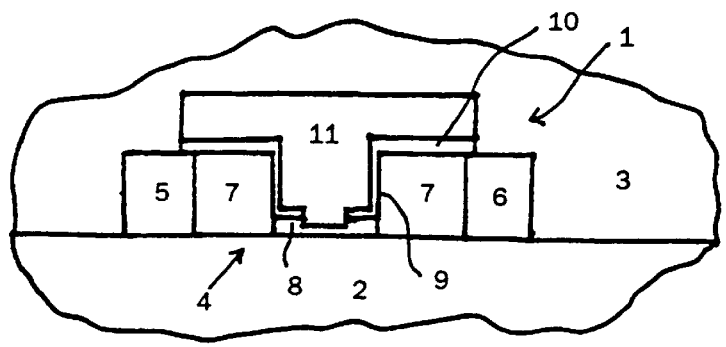
FIG. 4 is a sectional view through a further exemplary embodiment of the SOI-FET according to the invention, with a direct contact between electrode material and semiconductor zone of the other conductivity type.
Figure 5:
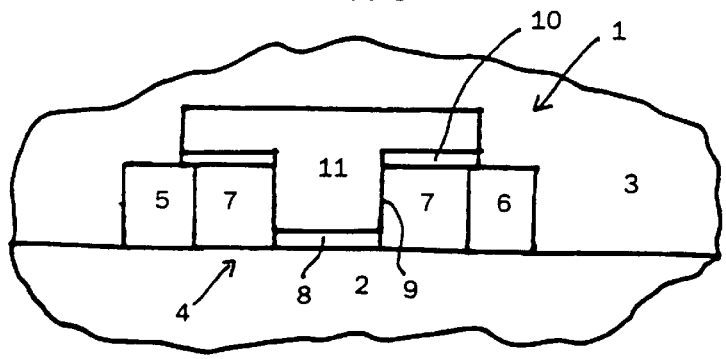
FIG. 5 is a sectional view through a further exemplary embodiment of the SOI-FET according to the invention, also with direct contact between the electrode material and the semiconductor zone of the other conductivity type.
Figure 6:
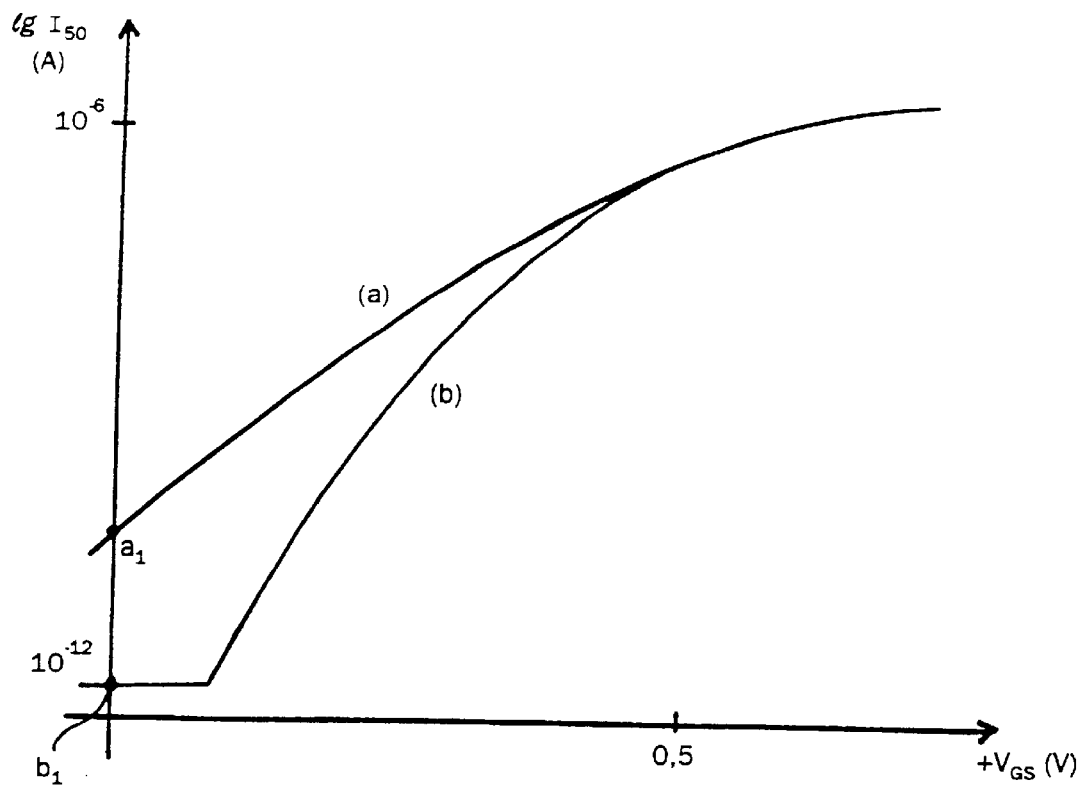
FIG. 6 is a graph of a source-drain current as a function of a gate-source voltage.
Figure 7:
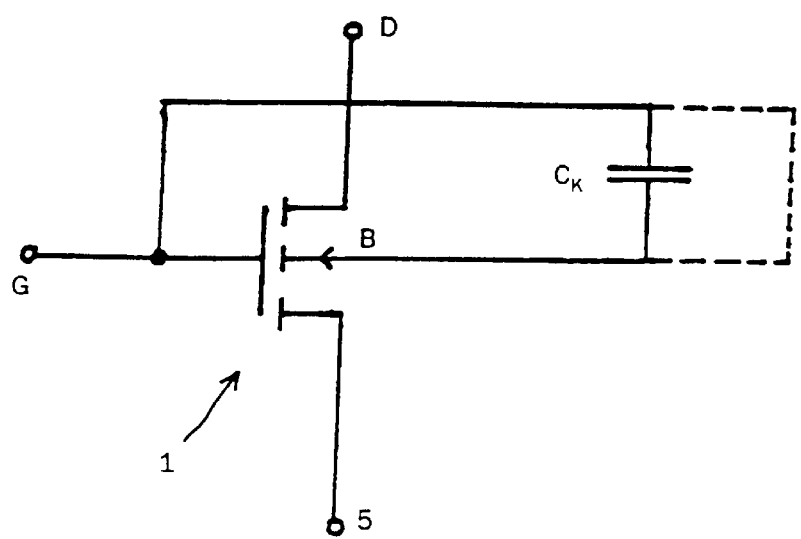
FIG. 7 is a representative circuit schematic of an SOI FET with a capacitor.

FIGS. 4 and 5 show two further exemplary embodiments of the SOI-FET according to the invention, in which there is a direct contact between the electrode material 11, the gate electrode and the semiconductor zone 8 (cf. FIG. 4) or the semiconductor zones 7, 8 (cf. FIG. 5), for which purpose either the gate insulating layer 10 is open through a window at the bottom of the trench 9 or this insulating layer 10 is omitted in the region of the trench 9, that is to say also on the side walls thereof.

The exemplary embodiments with direct connection (FIGS. 4 and 5) also achieve a considerable reduction in the reverse current, which reduction is of the same order of magnitude as in the case of the exemplary embodiments with capacitive coupling (FIGS. 1 to 3).

I claim:

1. An SOI-FET, comprising:

an insulator;

source and drain zones of a first conductivity type disposed on said insulator, said source and drain zones defining a connecting line therebetween;

a gate insulating layer disposed on said source and drain zones;

a gate disposed on said gate insulating layer;

a semiconductor zone of a second conductivity type disposed between said source and drain zones;

said semiconductor zone having a trench formed therein, and gate electrode material filling said trench, wherein said gate electrode material filling said trench is coupled to said semiconductor zone; and wherein said trench is offset laterally with respect to said connecting line.

2. The SOI-FET according to claim 1, wherein said gate electrode material filling said trench is capacitively coupled to said semiconductor zone.

3. The SOI-FET according to claim 1, wherein said gate electrode material filling said trench is in direct contact with said semiconductor zone.

4. The SOI-FET according to claim 1, wherein said trench is partly formed in a region between said source and drain zones.

5. The SOI-FET according to claim 1, wherein said trench is formed outside a region between said source and drain zones.

6. The SQI-FET according to claim 3, wherein said gate electrode material is directly connected to said semiconductor zone of the second conductivity type in a bottom region of said trench.

7. The SOI-FET according to claim 3, wherein said gate electrode material is directly connected to said semiconductor zone of the second conductivity type in a side wall region of said trench.

8. The SOI-FET according to claim 1, wherein said semiconductor zone underneath said trench is heavily doped by implantation.

9. The SOI-FET according to claim 1, wherein said semiconductor zone of the second conductivity type is p-doped.

10. An SOI-FET comprising:

an insulator;

source and drain zones of a first conductivity type disposed on said insulator;

a gate insulating layer disposed on said source and drain zones;

a gate disposed on said gate insulating layer;

a semiconductor zone of a second conductivity type disposed between said source and drain zones;

said semiconductor zone having a trench formed therein, and gate electrode material filling said trench, wherein said gate electrode material filling said trench is coupled to said semiconductor zone, and wherein said trench is a substantially circular trench.

11. An SOI-FET, comprising:

an insulator;

source and drain zones of a first conductivity type disposed on said insulator;

a gate insulating layer disposed on said source and drain zones;

a gate disposed on said gate insulating layer;

a semiconductor zone of a second conductivity type disposed between said source and drain zones;

said semiconductor zone having a trench formed therein, and gate electrode material filling said trench, wherein said gate electrode material filling said trench is coupled to said semiconductor zone, and wherein said trench has a diameter between 0.1 and 0.5 $\mu$m.

12. An SOI-FET comprising:

an insulator;

source and drain zones of a first conductivity type disposed on said insulator, said source and drain zones defining a connecting line therebetween;

a gate insulating layer disposed on said source and drain zones;

a gate disposed on said gate insulating layer;

a semiconductor zone of a second conductivity type disposed between said source and drain zones;

said semiconductor zone having a trench formed therein, and gate electrode material filling said trench, wherein said gate electrode material filling said trench is coupled to said semiconductor zone, and wherein said gate insulating layer has a thickness between 1 and 10 nm, and wherein said trench is offset laterally with respect to said connecting line.

13. An SOI-FET, comprising:

an insulator;

source and drain zones of a first conductivity type disposed on said insulator;

a gate insulating layer disposed on said source and drain zones;

a gate disposed on said gate insulating layer;

a semiconductor zone of a second conductivity type disposed between said source and drain zones;

said semiconductor zone having a trench formed therein, and gate electrode material filling said trench, wherein said gate electrode material filling said trench is coupled to said semiconductor zone, and wherein said semiconductor zone together with said source and drain zones encloses an area of substantially 0.5×0.2 $\mu$m.

14. The SOI-FET according to claim 1, wherein said source and drain zones and said semiconductor zone have a thickness of between 0.1 and 1.0 $\mu$m.

* * * * *